United States Patent
Togashi

(10) Patent No.: US 10,854,660 B2
(45) Date of Patent: Dec. 1, 2020

(54) SOLID-STATE IMAGE CAPTURING ELEMENT TO SUPPRESS DARK CURRENT, MANUFACTURING METHOD THEREOF, AND ELECTRONIC DEVICE

(71) Applicant: SONY CORPORATION, Tokyo (JP)

(72) Inventor: Hideaki Togashi, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 15/316,725

(22) PCT Filed: Jun. 11, 2015

(86) PCT No.: PCT/JP2015/066832
§ 371 (c)(1),
(2) Date: Dec. 6, 2016

(87) PCT Pub. No.: WO2015/198878
PCT Pub. Date: Dec. 30, 2015

(65) Prior Publication Data
US 2017/0148838 A1     May 25, 2017

(30) Foreign Application Priority Data

Jun. 25, 2014  (JP) ................. 2014-129950

(51) Int. Cl.
*H01L 27/146*   (2006.01)
*H04N 5/361*   (2011.01)
*H04N 5/374*   (2011.01)

(52) U.S. Cl.
CPC .... *H01L 27/14643* (2013.01); *H01L 27/1461* (2013.01); *H01L 27/1463* (2013.01);
(Continued)

(58) Field of Classification Search
CPC . H01L 27/14614; H01L 27/146–14616; H01L 29/78657
See application file for complete search history.

(56) References Cited

U.S. PATENT DOCUMENTS 6,127,712 A  *  10/2000  Wu ................... H01L 21/76895
257/386
6,380,572 B1 *  4/2002  Pain .................. H01L 27/14609
257/290

(Continued)

FOREIGN PATENT DOCUMENTS

JP       04-320346 A   11/1992
JP      2005-011863 A   1/2005
(Continued)

*Primary Examiner* — Stephen M Bradley
(74) *Attorney, Agent, or Firm* — Chip Law Group

(57) ABSTRACT

The present disclosure relates to a solid-state image capturing element capable of suppressing a dark current, a manufacturing method thereof, and an electronic device. Provided is a solid-state image capturing element including: a photoelectric conversion unit formed outside a semiconductor substrate; and a charge retention section that is formed in the semiconductor substrate and retains charges generated in the photoelectric conversion unit. Among surfaces of the charge retention section, a bottom surface on a side opposite to a surface of a gate side of a transistor formed in the semiconductor substrate is covered by an insulation film. The present disclosure can be applied to, for example, solid-state image capturing elements and the like.

14 Claims, 15 Drawing Sheets

(52) U.S. Cl.
CPC .... *H01L 27/1464* (2013.01); *H01L 27/14614* (2013.01); *H01L 27/14636* (2013.01); *H01L 27/14645* (2013.01); *H01L 27/14665* (2013.01); *H01L 27/14689* (2013.01); *H04N 5/361* (2013.01); *H04N 5/3741* (2013.01)

(56) References Cited

U.S. PATENT DOCUMENTS

| | | | |
|---|---|---|---|
| 7,157,317 B2 * | 1/2007 | Arao | H01L 29/66757 257/E21.413 |
| 7,510,917 B2 * | 3/2009 | Zhang | G02F 1/13454 438/154 |
| 2006/0192233 A1 * | 8/2006 | Ellis-Monaghan | H01L 27/14603 257/292 |
| 2007/0012970 A1 | 1/2007 | Mouli | |
| 2008/0067591 A1 * | 3/2008 | Tani | H01L 29/66772 257/347 |
| 2011/0156104 A1 * | 6/2011 | Yamaguchi | H01L 27/14603 257/222 |
| 2013/0032919 A1 * | 2/2013 | Watanabe | H01L 27/1461 257/443 |
| 2014/0339614 A1 * | 11/2014 | Fang | H01L 27/1461 257/292 |
| 2015/0090998 A1 * | 4/2015 | Hirase | H01L 27/14614 257/40 |

FOREIGN PATENT DOCUMENTS

| | | |
|---|---|---|
| JP | 2008-071957 A | 3/2008 |
| JP | 4491323 B2 | 6/2010 |
| JP | 2010-251496 A | 11/2010 |
| JP | 2013-085164 A | 5/2013 |
| JP | 2013-093353 A | 5/2013 |
| JP | 2014-078673 A | 5/2014 |
| WO | 2013/097660 A1 | 7/2013 |

* cited by examiner

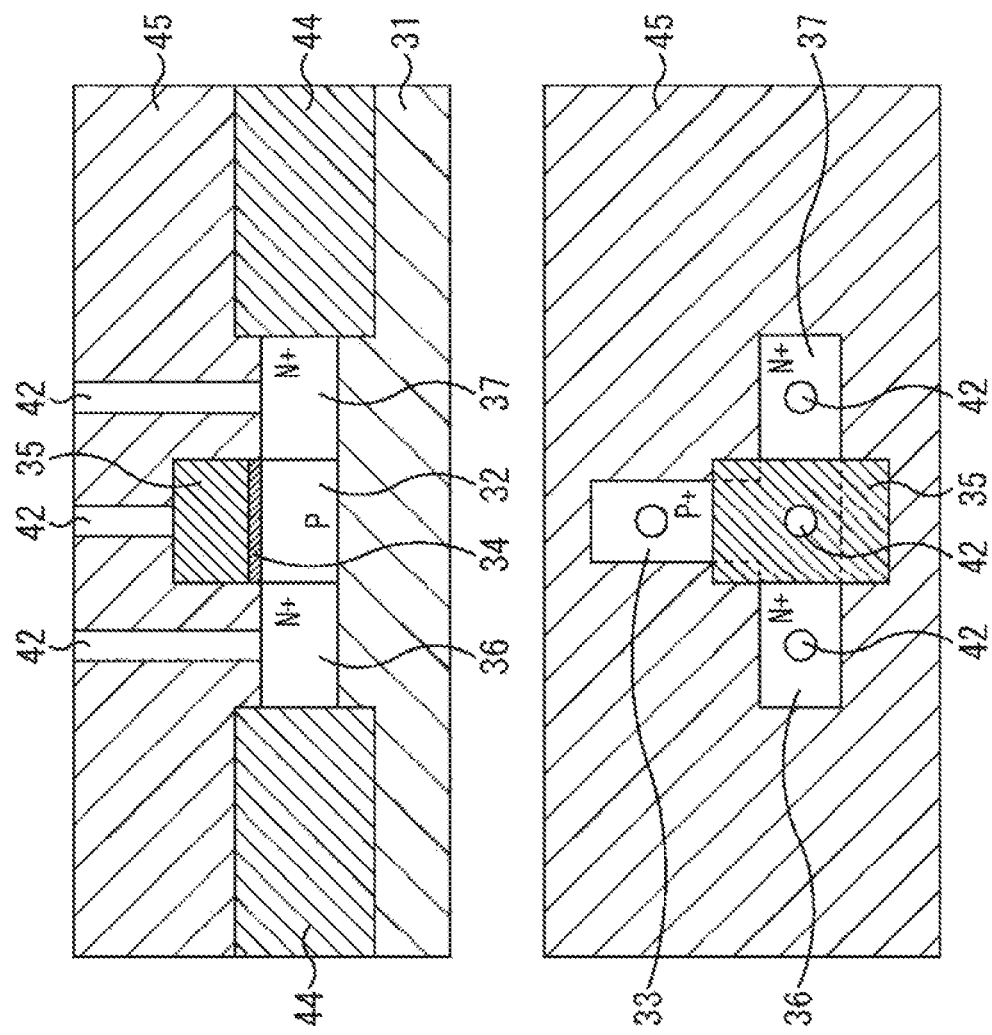

SOLID-STATE IMAGE CAPTURING ELEMENT TO SUPPRESS DARK CURRENT, MANUFACTURING METHOD THEREOF, AND ELECTRONIC DEVICE

CROSS REFERENCE TO RELATED APPLICATIONS

This application is a U.S. National Phase of International Patent Application No. PCT/JP2015/066832 filed on Jun. 11, 2015, which claims priority benefit of Japanese Patent Application No. JP 2014-129950 filed in the Japan Patent Office on Jun. 25, 2014. Each of the above-referenced applications is hereby incorporated herein by reference in its entirety.

TECHNICAL FIELD

The present disclosure relates to a solid-state image capturing element, a manufacturing method thereof, and an electronic device, and particularly, to a solid-state image capturing element capable of suppressing a dark current, a manufacturing method thereof, and an electronic device.

BACKGROUND ART

A solid-state image capturing element having a structure in which signal charges that are photoelectrically converted in a photoelectric conversion unit installed outside a semiconductor substrate are accumulated in the semiconductor substrate is proposed (for example, refer to Patent Literatures 1 to 3).

CITATION LIST

Patent Literature

Patent Literature 1 JP 4491323B
Patent Literature 2 JP 2013-85164A
Patent Literature 3 JP 2013-93353A

SUMMARY OF INVENTION

Technical Problem

In a solid-state image capturing element having a structure in which a photoelectric conversion unit is installed outside a semiconductor substrate, it is necessary to form a contact portion for capturing signal charges that are photoelectrically converted by the photoelectric conversion unit in the semiconductor substrate in the semiconductor substrate. In this case, a depletion layer is formed between the contact portion and a surrounding area of the semiconductor substrate having an opposite conductivity type to the contact portion. Since the depletion layer serves as a generation source of a dark current, a structure for suppressing a dark current is preferable.

In view of such circumstances, the present disclosure makes it possible to suppress a dark current.

Solution to Problem

According to a first aspect of the present disclosure, there is provided a solid-state image capturing element including: a photoelectric conversion unit formed outside a semiconductor substrate; and a charge retention section that is formed in the semiconductor substrate and retains charges generated in the photoelectric conversion unit. Among surfaces of the charge retention section, a bottom surface on a side opposite to a surface of a gate side of a transistor formed in the semiconductor substrate is covered by an insulation film.

According to a second aspect of the present disclosure, there is provided a method of manufacturing a solid-state image capturing element, the method including: forming the charge retention section in a semiconductor layer that is formed on an insulation film of a semiconductor substrate; and forming a photoelectric conversion unit outside the semiconductor substrate. Among surfaces of the charge retention section, a bottom surface on a side opposite to a surface of a gate side of a transistor formed in the semiconductor substrate is covered by the insulation film.

According to a third aspect of the present disclosure, there is provided an electronic device including: a solid-state image capturing element including a photoelectric conversion unit formed outside a semiconductor substrate, and a charge retention section that is formed in the semiconductor substrate and retains charges generated in the photoelectric conversion unit. Among surfaces of the charge retention section, a bottom surface on a side opposite to a surface of a gate side of a transistor formed in the semiconductor substrate is covered by an insulation film.

According to the first to third aspects of the present disclosure, a photoelectric conversion unit formed outside a semiconductor substrate, and a charge retention section that is formed in the semiconductor substrate and retains charges generated in the photoelectric conversion unit are included. Among surfaces of the charge retention section, a bottom surface on a side opposite to a surface of a gate side of a transistor formed in the semiconductor substrate is covered by an insulation film.

The solid-state image capturing element or the electronic device may be an independent device or may be a module incorporated into another device.

Advantageous Effects of Invention

According to the first to third aspects of the present disclosure, it is possible to suppress a dark current.

The effect described herein is not necessarily limited, and any effect described in the present disclosure may be included.

BRIEF DESCRIPTION OF DRAWINGS

FIG. 16 is a diagram illustrating a second modified example of the pixel structure of the first embodiment.

DESCRIPTION OF EMBODIMENT(S)

Hereinafter, forms (hereinafter referred to as "embodiments") for performing the present disclosure will be described. The description will proceed in the following order.

1. First embodiment (pixel structure example in which bottom surface of charge retention section is insulation film)
2. Second embodiment (pixel structure example in which there are plurality of photoelectric conversion units outside semiconductor substrate)
3. Third embodiment (pixel configuration example in which there are two photodiodes in semiconductor substrate)
4. Fourth embodiment (pixel configuration example in which there are two photodiodes in semiconductor substrate)
5. Examples of applications to electronic device

1. First Embodiment

<Exemplary Schematic Configuration of Solid-State Image Capturing Element>

Figure 1:
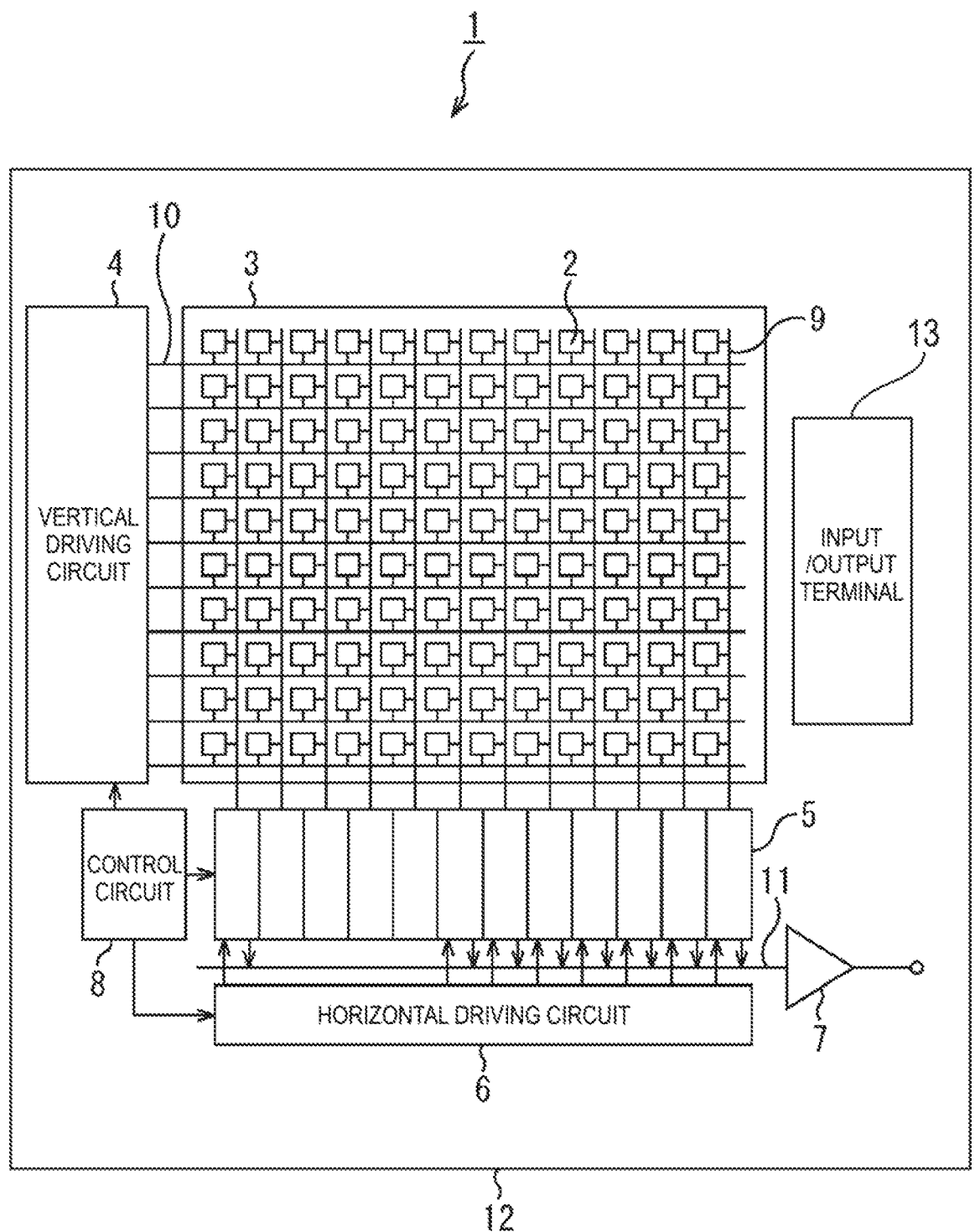
FIG. 1 is a diagram illustrating a schematic configuration of a solid-state image capturing element according to the present disclosure.

FIG. 1 illustrates a schematic configuration of a solid-state image capturing element according to the present disclosure.

A solid-state image capturing element 1 of FIG. 1 is configured to include a pixel array unit 3 in which pixels 2 are arranged on a semiconductor substrate 12 using, for example, silicon (Si) as a semiconductor in a two-dimensional (2D) array form and a peripheral circuit unit arranged therearound. The peripheral circuit unit includes a vertical driving circuit 4, column signal processing circuits 5, a horizontal driving circuit 6, an output circuit 7, a control circuit 8, and the like.

Each of the pixels 2 is configured with a photoelectric conversion unit and a plurality of pixel transistors. For example, a plurality of pixel transistors are configured with three MOS transistors, that is, a selecting transistor, a reset transistor, and an amplifying transistor.

In addition, the pixel 2 can have a shared pixel structure in which a photoelectric conversion unit is arranged for each pixel and floating diffusion (a floating diffusion region) and a plurality of pixel transistors are shared among the plurality of pixels 2.

The control circuit 8 receives data for instructing an input clock, an operation mode, or the like, and outputs data such as internal information of the solid-state image capturing element 1. In other words, the control circuit 8 generates a clock signal and a control signal serving as a reference of operations of the vertical driving circuit 4, the column signal processing circuits 5, the horizontal driving circuit 6, and the like based on a vertical synchronous signal, a horizontal synchronous signal, and a master clock. Then, the control circuit 8 outputs the generated clock signal and the control signal to the vertical driving circuit 4, the column signal processing circuits 5, the horizontal driving circuit 6, and the like.

The vertical driving circuit 4 is configured with, for example, a shift register, and selects a predetermined pixel driving line 10, supplies pulses for driving the pixels 2 to the selected pixel driving line 10, and drives the pixels 2 in units of rows. In other words, the vertical driving circuit 4 selectively scans the pixels 2 of the pixel array unit 3 sequentially in the vertical direction in units of rows, and supplies pixel signals based on signal charges generated according to an amount of received light in the photoelectric conversion units of the pixels 2 to the column signal processing circuits 5 via a column signal line 9.

The column signal processing circuit 5 is arranged for each column of the pixels 2, and performs signal processing such as noise reduction on the signals output from the pixels 2 of one row for each column of pixels. For example, the column signal processing circuit 5 performs signal processing such as correlated double sampling (CDS) for removing pixel-specific fixed pattern noise and AD conversion.

The horizontal driving circuit 6 is configured with, for example, a shift register, and sequentially outputs horizontal scan pulses, sequentially selects the column signal processing circuits 5, and outputs the pixel signals of the column signal processing circuits 5 to a horizontal signal line 11.

The output circuit 7 performs signal processing on the signals sequentially supplied from the column signal processing circuits 5 via the horizontal signal line 11, and outputs resulting data. For example, the output circuit 7 may perform only buffering or may perform various types of digital signal processing such as black level adjustment and column variation correction. An input/output terminal 13 exchanges a signal with the outside.

The solid-state image capturing element 1 having the above configuration is a CMOS image sensor called a column AD system in which the column signal processing circuits 5 performing the CDS process and the AD conversion process are arranged for each column of pixels.

<Equivalent Circuit of Pixel>

Figure 2:
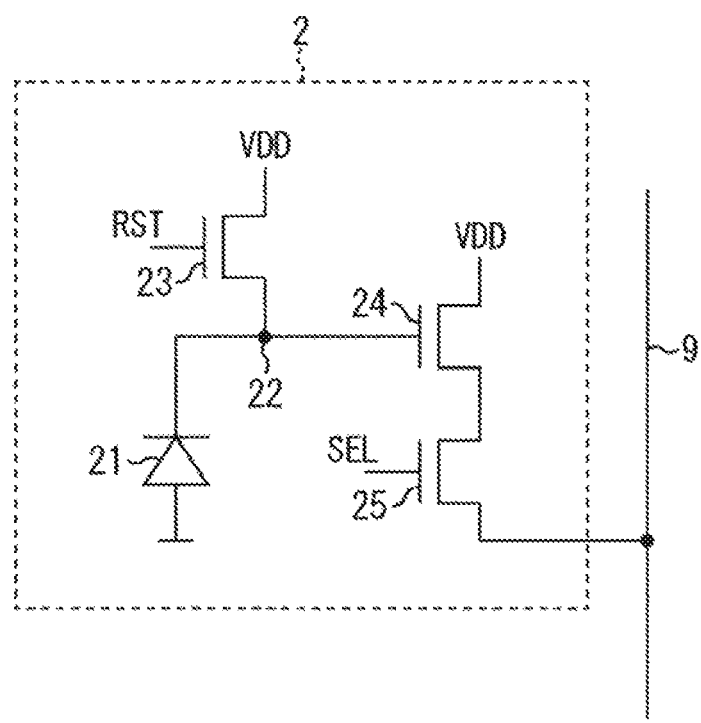
FIG. 2 is a diagram illustrating an equivalent circuit of a pixel.

FIG. 2 shows an equivalent circuit of the pixel 2.

The pixel 2 shown in FIG. 2 includes a photoelectric conversion unit 21, a charge retention section 22, a reset transistor 23, an amplifying transistor 24, and a selecting transistor 25.

The photoelectric conversion unit 21 generates and accumulates a charge (a signal charge) according to an amount of received light. One end of the photoelectric conversion unit 21 is set to a predetermined voltage and the other end thereof is connected to the charge retention section 22, a source of the reset transistor 23 and a gate of the amplifying transistor 24.

The charge retention section 22 includes, for example, floating diffusion (a floating diffusion region) and retains charges generated in the photoelectric conversion unit 21. Since the charge retention section 22 is connected to one end of the photoelectric conversion unit 21, the source of the reset transistor 23, and the gate of the amplifying transistor 24, which will be described in FIG. 3, actually, these all retain charges.

When the reset transistor 23 is turned on according to a reset signal RST that is supplied to a gate, charges accumulated in the charge retention section 22 are discharged to a drain (a power supply voltage VDD). Thus, a potential of the charge retention section 22 is reset.

The amplifying transistor 24 includes a gate that is connected to the charge retention section 22, a drain that is connected to a power supply voltage VDD, and a source that is connected to a drain of the selecting transistor 25. The amplifying transistor 24 outputs a pixel signal according to a potential of the charge retention section 22. That is, the amplifying transistor 24 includes a load MOS (not illustrated) as a constant current source that is connected through the column signal line 9 and a source follower circuit, and a pixel signal of a level according to charges accumulated in the charge retention section 22 is output to the column signal processing circuit 5 (FIG. 1) through the selecting transistor 25 from the amplifying transistor 24. The load MOS is provided in, for example, the column signal processing circuit 5.

The selecting transistor 25 includes a drain that is connected to the source of the amplifying transistor 24 and a source that is connected to the column signal line 9 that transfers a pixel signal of the pixels 2 that are arranged in a column direction (a vertical direction). The selecting transistor 25 is turned on when the pixel 2 is selected by a selection signal SEL that is supplied to a gate and outputs a pixel signal of the pixel 2 to the column signal processing circuit 5 through the column signal line 9.

<Cross-Sectional Structure of Pixel>

Figure 3:
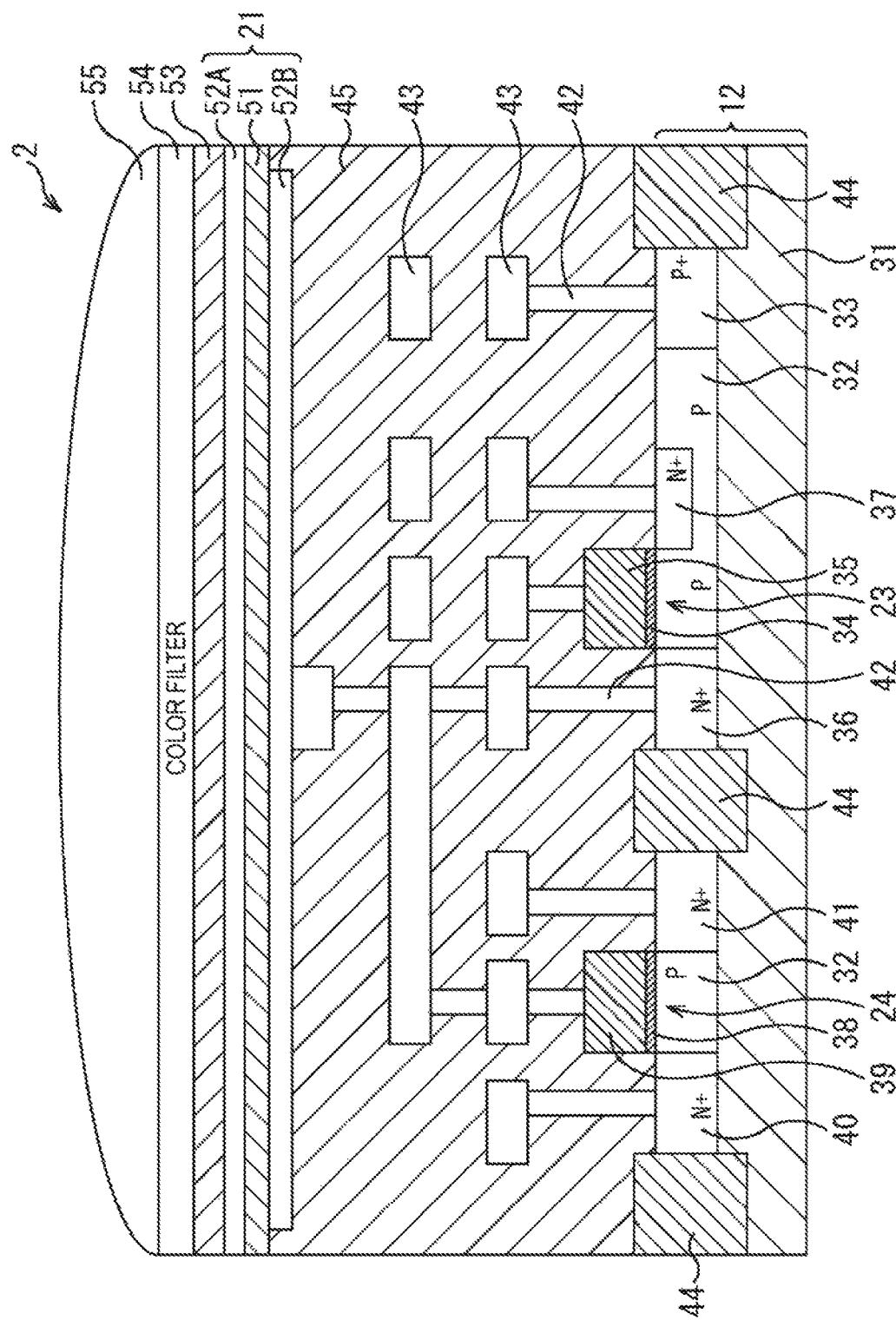
FIG. 3 is a cross-sectional view illustrating a pixel structure according to a first embodiment of a solid-state image capturing element.

FIG. 3 is a diagram illustrating a cross-sectional structure of the pixel 2.

In the pixel structure shown in FIG. 3, a silicon on insulator (SOI) substrate is used as the semiconductor substrate 12. A silicon layer 30 (not illustrated) including P type (first conductivity type) semiconductor regions 32 and 33 is laminated above an insulation film (SiO2) 31 of the SOI substrate serving as the semiconductor substrate 12.

In the pixel 2, in the drawing of the insulation film 31 of the semiconductor substrate 12 using the SOI substrate, a pixel transistor such as the reset transistor 23 and the amplifying transistor 24 is formed on an upper surface.

Specifically, the reset transistor 23 includes a gate electrode 35 that is formed on the P type semiconductor region 32 through a gate insulation film 34 and N type (second conductivity type) semiconductor regions 36 and 37. The N type semiconductor region 36 is the source of the reset transistor 23 and the N type semiconductor region 37 is the drain of the reset transistor 23.

The amplifying transistor 24 includes a gate electrode 39 that is formed on the P type semiconductor region 32 through a gate insulation film 38 and N type semiconductor regions 40 and 41. The N type semiconductor region 40 is the source of the amplifying transistor 24 and the N type semiconductor region 41 is the drain of the amplifying transistor 24.

In FIG. 3, the selecting transistor 25 is not illustrated. In addition, in FIG. 3, "N+" indicates an N type semiconductor region of a high concentration and "P+" indicates a P type semiconductor region of a high concentration. "P" indicates a lower concentration than "P+."

The N type semiconductor region 36, which is the source of the reset transistor 23, also serves as the charge retention section 22. The N type semiconductor region 36 serving as the charge retention section 22 is connected to a lower electrode 52B of the photoelectric conversion unit 21 to be described and the gate electrode 39 of the amplifying transistor 24 through a contact electrode 42 and a wiring layer 43. Therefore, actually, charges are retained in all of the N type semiconductor region 36 serving as the charge retention section 22, the lower electrode 52B of the photoelectric conversion unit 21, and the gate electrode 39 of the amplifying transistor 24. The contact electrode 42 and the wiring layer 43 are formed of a metal material such as aluminum, tungsten, titanium, cobalt, hafnium, or tantalum. The gate electrodes 35 and 39 are formed of, for example, polysilicon.

The P type semiconductor region 33 is a contact portion to which a fixed potential for fixing the P type semiconductor region 32 to a GND potential is supplied. The contact electrode 42 is connected to the P type semiconductor region 33 and a GND potential is supplied from the wiring layer 43 through the contact electrode 42.

An insulation film 44 that is formed in a separate process from the insulation film 31 is provided between the N type semiconductor region 36 serving as the source of the reset transistor 23 and the N type semiconductor region 41 serving as the drain of the amplifying transistor 24. In addition, the insulation film 44 is provided to be adjacent to the N type semiconductor region 40 serving as the source of the amplifying transistor 24, and the insulation film 44 is provided to be adjacent to the P type semiconductor region 33 serving as the contact portion to which a fixed potential is supplied. Accordingly, the pixel transistors of the pixels 2 are electrically separated by the insulation film 31 and the insulation film 44. The insulation film 44 is formed through, for example, shallow trench isolation (STI). In addition, the insulation film 44 can be formed by a local oxidation of silicon (LOCOS) method.

A plurality of wiring layers 43 formed above the semiconductor substrate 12 are laminated through an insulation film 45. While the wiring layer 43 of two layers is illustrated in FIG. 3, the wiring layer 43 may have three or more layers. In addition, while the insulation film 45 of a single layer is illustrated in FIG. 3, the insulation film 45 can be formed in a structure in which a plurality of types of insulating layers are laminated using a different type of formation method. Then, the photoelectric conversion unit 21 is formed on the insulation film 45 including the plurality of wiring layers 43.

The photoelectric conversion unit 21 has a structure in which a photoelectric conversion film 51 is interposed between an upper electrode 52A and the lower electrode 52B. As the photoelectric conversion film 51, for example, an organic photoelectric conversion film or a compound semiconductor such as CIGS (a Cu, In, Ga, and Se compound), CIS (a Cu, In, and Se compound), a chalcopyrite structure semiconductor, and GaAs can be used. The upper electrode 52A is formed of a transparent electrode film, for example, an indium tin oxide (ITO) film or an indium zinc oxide film. The lower electrode 52B is formed of an electrode film, for example, tungsten (W), aluminum (Al), or copper (Cu). In addition, the lower electrode 52B can be formed of a transparent electrode film, similarly to the upper electrode 52A. While the upper electrode 52A is formed on an entire surface common to all pixels, the lower electrode 52B is formed in units of pixels. A predetermined voltage is applied to the upper electrode 52A.

A color filter 54 and an on-chip lens 55 are formed above the upper electrode 52A through a protective film (an insulation film) 53. In the color filter 54, for example, red, green, and blue are arranged in a Bayer array in units of pixels. Therefore, the photoelectric conversion film 51 photoelectrically converts any light of red, green and blue that has passed through the color filter 54.

As described above, the pixel 2 of the solid-state image capturing element 1 has a structure in which the photoelectric conversion unit 21 is installed outside the semiconductor substrate 12. Signal charges that are photoelectrically converted by the photoelectric conversion unit 21 are retained in all of the N type semiconductor region 36 serving as the charge retention section 22, the lower electrode 52B of the photoelectric conversion unit 21, and the gate electrode 39 of the amplifying transistor 24.

Here, since the N type semiconductor region 36 serving as the charge retention section 22 is in contact with the P type semiconductor region 32 that has an opposite conductivity type, a depletion layer is formed. The depletion layer may be a generation source of a dark current.

Therefore, in a first embodiment of the present disclosure, a peripheral part of the N type semiconductor region 36 has a structure that suppresses generation of a dark current. Hereinafter, a structure around the N type semiconductor region 36 will be described in detail.

<Detailed Structure Around N Type Semiconductor Region 36>

Figure 4A:
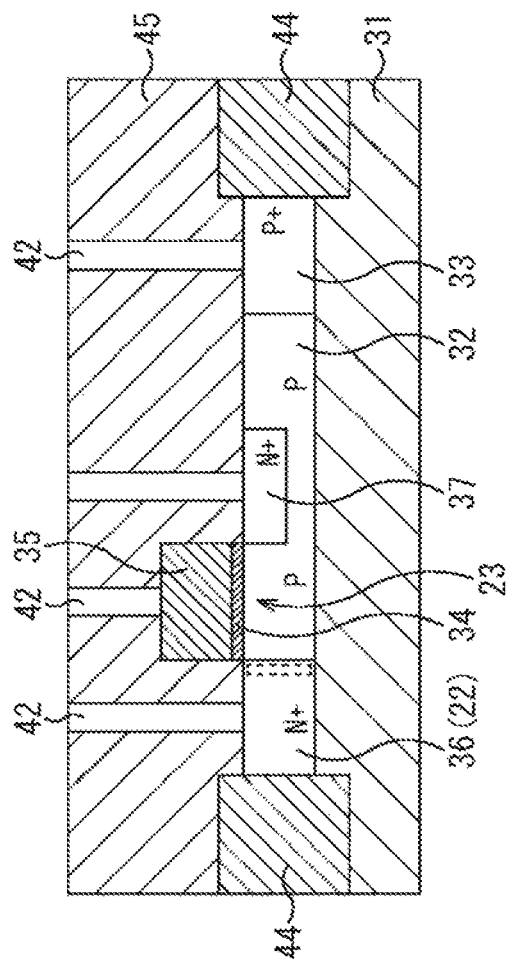
FIG. 4A and FIG. 4B shows diagrams illustrating a detailed structure of a part of a pixel.
Figure 4B:
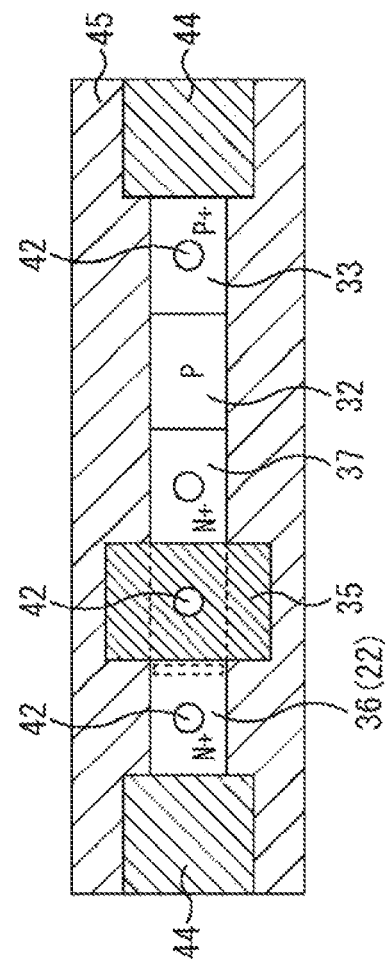

FIG. 4A is a cross-sectional view around the N type semiconductor region 36 serving as the charge retention section 22. FIG. 4B is a top view around the N type semiconductor region 36.

In the top view of FIG. 4B, the insulation film 45 on a top surface of the N type semiconductor regions 36 and 37 and the P type semiconductor regions 32 and 33 is not illustrated so that a correspondence with FIG. 4A can be easily understood.

In the first embodiment, as illustrated in FIG. 4A, a bottom surface (a surface opposite to a surface of the gate electrode 35 side) of the N type semiconductor region 36 is in contact with the insulation film 31 of the semiconductor substrate (SOI substrate) 12. In addition, a top surface (a surface on the gate electrode 35 side) of the N type semiconductor region 36 is covered by the insulation film 45 except the contact electrode 42 that is electrically connected to the lower electrode 52B of the photoelectric conversion unit 21. Further, in side surfaces of the N type semiconductor region 36, one surface (a right side surface in the drawing) of four surfaces is in contact with the P type semiconductor region 32 and a surface (a left side surface in the drawing) facing a surface in contact with the P type semiconductor region 32 is in contact with the insulation film 44. The remaining two surfaces are in contact with the insulation film 45 as illustrated in FIG. 4B. Therefore, three of the four side surfaces of the N type semiconductor region 36 are in contact with the insulation film 44 or 45.

In FIG. 4A and FIG. 4B, the depletion layer formed in the pixel structure of the first embodiment is indicated by dashed lines in the N type semiconductor region 36.

<Comparative Pixel Structure>

Figure 5A:
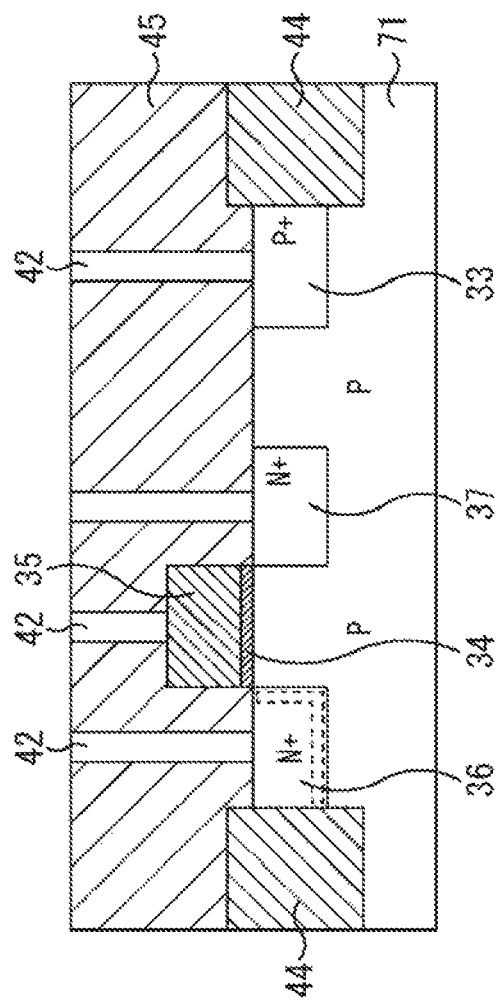
FIG. 5A and FIG. 5B shows diagrams illustrating a comparative pixel structure.
Figure 5B:
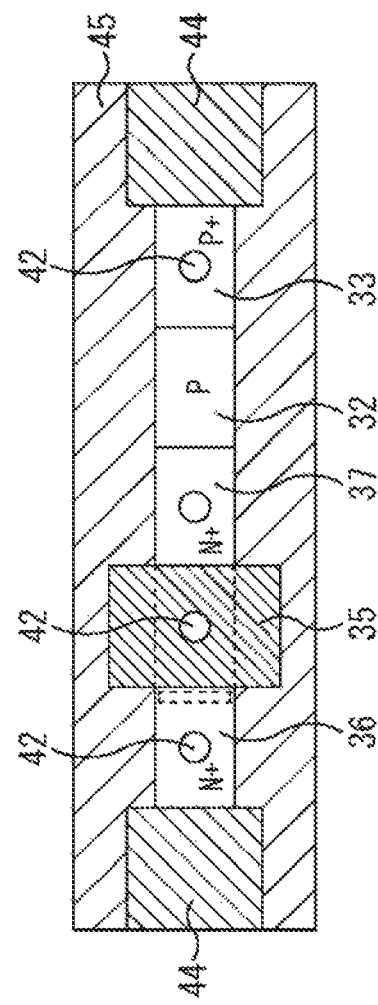

FIG. 5A and FIG. 5B shows a pixel structure on which a depletion layer measure for suppressing a dark current is not performed, which is a comparative pixel structure for comparison with the pixel structure of the first embodiment. FIG. 5A is a cross-sectional view around the N type semiconductor region 36. FIG. 5B is a top view around the N type semiconductor region 36. Similarly to FIG. 4B, a part of the insulation film 45 is not illustrated in the top view of FIG. 5B.

In the pixel structure on which a depletion layer measure for suppressing a dark current is not performed, as illustrated in FIG. 5A, the N type semiconductor region 36 is formed on a part of a P type semiconductor region 71 serving as a P-Well. Therefore, the comparative pixel structure is a structure in which a bottom surface of the N type semiconductor region 36 is also in contact with the P type semiconductor region 71 in addition to one side surface of the N type semiconductor region 36.

In FIG. 5A and FIG. 5B, the depletion layer formed in the comparative pixel structure is indicated by dashed lines in the N type semiconductor region 36.

<Comparison of Depletion Layer Regions>

Depletion layer regions of the pixel structure of the first embodiment shown in FIG. 4A and FIG. 4B and the comparative pixel structure shown in FIG. 5A and FIG. 5B are compared with reference to FIGS. 6A, 6B, 6C, 6D and 6E.

Figure 6A:
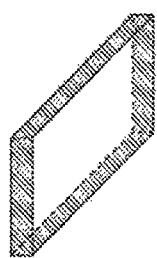
FIGS. 6A, 6B, 6C, 6D and 6E shows comparison diagrams illustrating depletion layer regions of the pixel structure of the first embodiment and the comparative pixel structure of FIG. 5A and FIG. 5B.
Figure 6B:
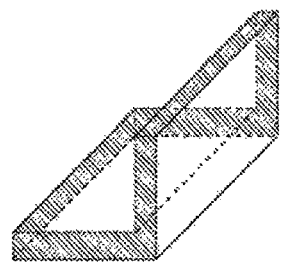

FIG. 6A is a pattern diagram illustrating a region of the depletion layer in the pixel structure of the first embodiment shown in FIG. 4A and FIG. 4B. FIG. 6B is a pattern diagram illustrating a region of the depletion layer in the comparative pixel structure shown in FIG. 5A and FIG. 5B. Since an actual region of the depletion layer has a round shape due to an influence of ion implantation or thermal diffusion, it does not have such a linear shape.

As can be seen from the comparison with FIG. 6A and FIG. 6B, since the pixel structure of the first embodiment has a smaller area in contact with the P type semiconductor region 32 or 71 than the comparative pixel structure of FIG. 5A and FIG. 5B, the depletion layer region is reduced. Accordingly, it is possible to suppress generation of a dark current.

In addition, in FIG. 6A and FIG. 6B, a region of the depletion layer in contact with the insulation film 31, 44, or 45 is indicated by oblique lines.

Between a region in contact with the insulation film and the other region within the depletion layer region, a rate at which a dark current is generated in a depletion layer is higher in the region in contact with the insulation film. Therefore, it is important to reduce the region of the depletion layer in contact with the insulation film 31, 44, or 45.

It can be understood that, when areas of regions indicated by oblique lines are compared, in the pixel structure of the first embodiment, a bottom surface of the N type semiconductor region 36 is covered by the insulation film 31, and thus a surface region of the depletion layer in contact with the insulation film 31, 44, or 45 is significantly reduced, compared to the comparative pixel structure of FIG. 5A and FIG. 5B. Therefore, in view of the surface region in contact with the insulation film 31, 44, or 45, the pixel structure of the first embodiment can suppress generation of a dark current compared to the comparative pixel structure of FIG. 5A and FIG. 5B.

Figure 6C:
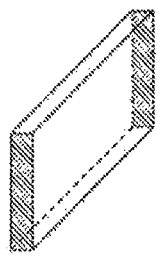
Figure 6D:
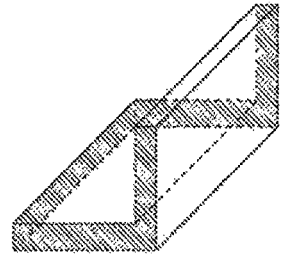

In FIG. 6C and FIG. 6D, within surfaces of the depletion layer regions of the pixel structure of the first embodiment shown in FIG. 4A, 4B and the comparative pixel structure shown in FIG. 5A and FIG. 5B, a processed surface formed by performing a process such as dry etching is indicated by oblique lines.

Figure 6E:
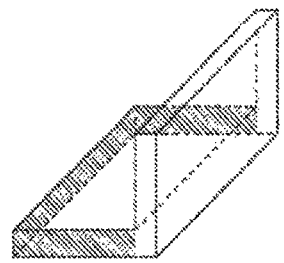

In FIG. 6E, a difference of areas of oblique line parts of FIG. 6C and FIG. 6D, that is, a processed surface when the pixel structure of the first embodiment is used that is reduced compared to the comparative pixel structure of FIG. 5A and FIG. 5B, is indicated by oblique lines.

When a semiconductor region surface (a processed surface) processed by, for example, dry etching is compared with the other surface, a plane orientation of the semiconductor region is not uniform and the surface is relatively rough when viewed microscopically. When silicon is subjected to thermal oxidation treatment and a thermally oxidized film is formed on such a surface, an interface state between SiO2/Si increases. Therefore, in order to decrease a dark current, it is favorable to reduce an area of the processed surface.

When the pixel structure of the first embodiment is used, as illustrated in FIG. 6E, compared to the comparative pixel structure of FIG. 5A and FIG. 5B, it is possible to reduce an area of the processed surface. As a result, it is possible to reduce a dark current. That is, according to the pixel structure of the first embodiment of the solid-state image capturing element 1, it is possible to suppress a dark current.

<Manufacturing Method>

A method of manufacturing a part shown in FIG. 4A and FIG. 4B of the pixel structure of the first embodiment will be described with reference to FIG. 7 to FIG. 14.

Figure 7:
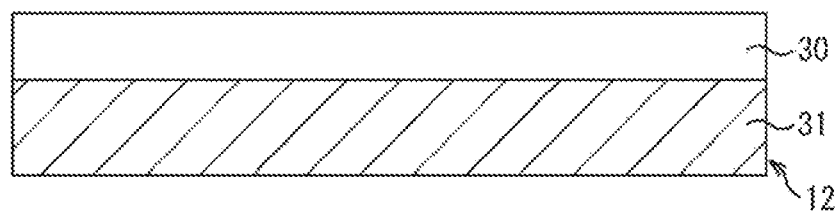
FIG. 7 is a diagram describing a method of manufacturing a pixel structure of the first embodiment.

First, as illustrated in FIG. 7, as the semiconductor substrate 12, the SOI substrate in which the silicon layer (semiconductor layer) 30 is laminated above the insulation film 31 is formed or prepared. It is also possible to use the semiconductor substrate 12 of an isolation SOI structure.

Figure 8:
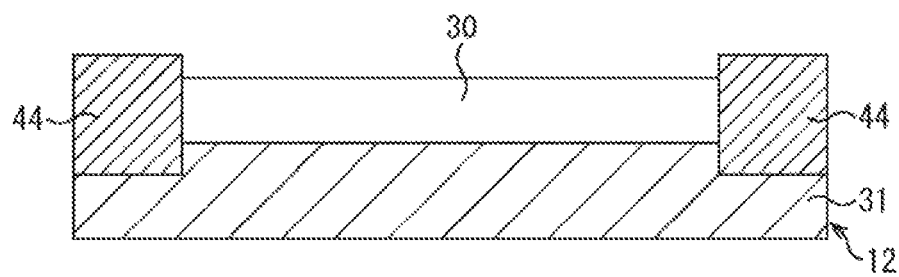
FIG. 8 is a diagram describing a method of manufacturing a pixel structure of the first embodiment.

Next, as illustrated in FIG. 8, the insulation film 44 is formed through, for example, STI. The insulation film 44 may be formed by a thermal oxidation method through which the silicon layer 30 is subjected to heat treatment and an oxide film is formed.

Figure 9:
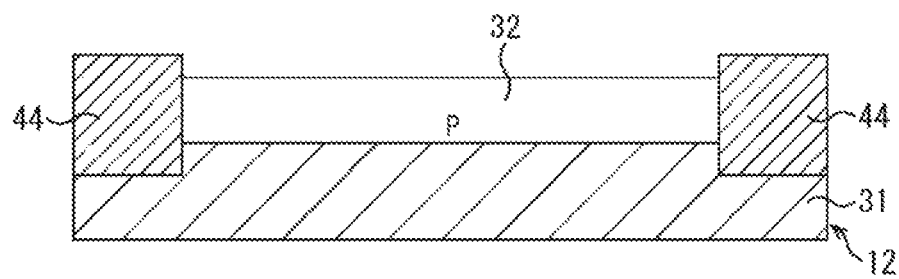
FIG. 9 is a diagram describing a method of manufacturing a pixel structure of the first embodiment.

Next, as illustrated in FIG. 9, when P type ions, for example, B (boron) or BF2 (boron fluoride), are injected into the silicon layer 30, the P type semiconductor region 32 is formed.

Figure 10:
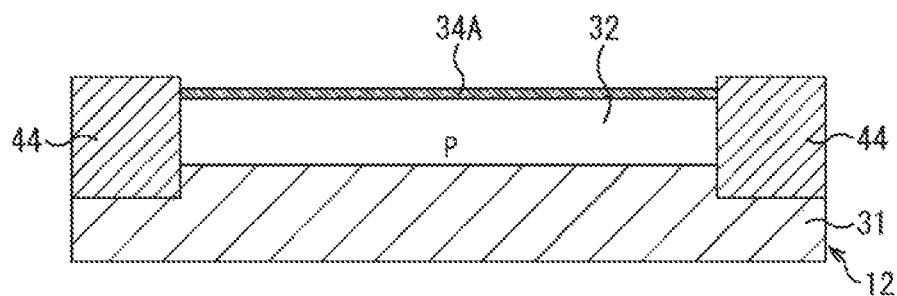
FIG. 10 is a diagram describing a method of manufacturing a pixel structure of the first embodiment.
Figure 11:
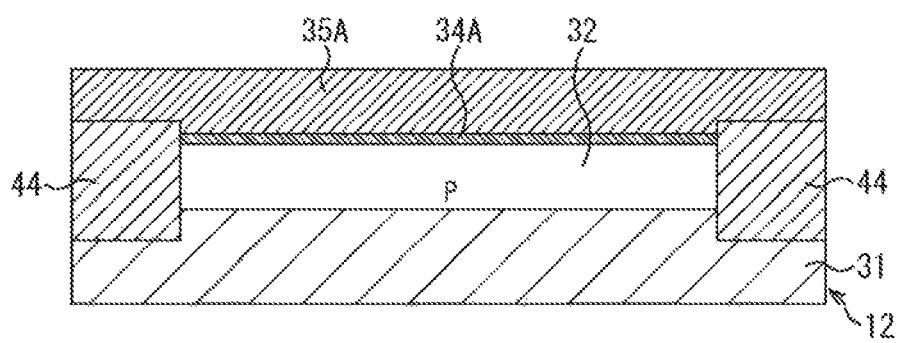
FIG. 11 is a diagram describing a method of manufacturing a pixel structure of the first embodiment.

Next, as illustrated in FIG. 10, the gate insulation film 34A is formed on a top surface of the P type semiconductor region 32. Further, as illustrated in FIG. 11, the gate electrode film 35A is formed above a gate electrode film 35A.

Figure 12:
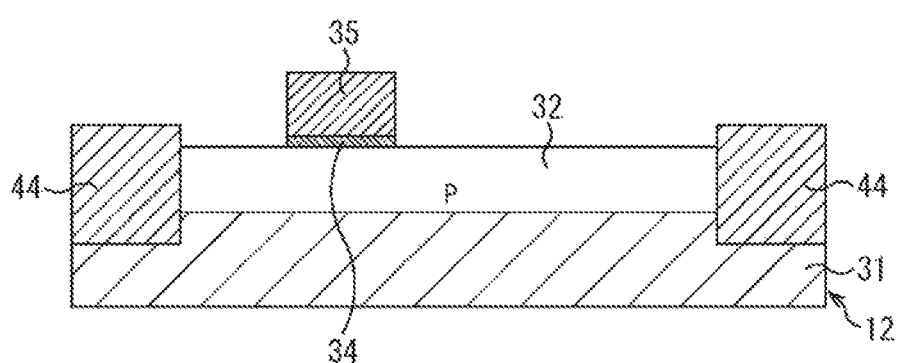
FIG. 12 is a diagram describing a method of manufacturing a pixel structure of the first embodiment.

In the gate insulation film 34A and the gate electrode film 35A that are formed on the entire surface, a region other than a region in which the reset transistor 23 is formed is etched, and the gate insulation film 34 and the gate electrode 35 are formed, as illustrated in FIG. 12.

Figure 13:
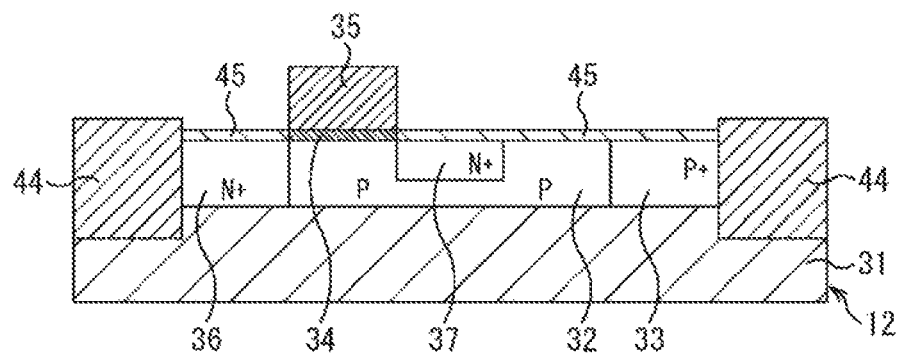
FIG. 13 is a diagram describing a method of manufacturing a pixel structure of the first embodiment.

Therefore, as illustrated in FIG. 13, the insulation film 45 is formed by, for example, a thermal oxidation method, an atomic layer deposition (ALD) method, or a plasma chemical vapor deposition (CVD) method, on a top surface of the P type semiconductor region 32 that is exposed when the gate insulation film 34A and the gate electrode film 35A are removed.

In addition, when N type ions, for example, phosphorus (P) or arsenic (As), are injected into a predetermined region of the P type semiconductor region 32, the source of the reset transistor 23, the N type semiconductor region 36 that also serves as the charge retention section 22, and the N type semiconductor region 37 serving as the drain of the reset transistor 23 are formed.

In addition, when P type ions, for example, B (boron) or BF2 (boron fluoride), are injected into a predetermined region of the P type semiconductor region 32, the P type semiconductor region 33 serving as a contact portion for fixation to a GND potential is formed.

Figure 14:
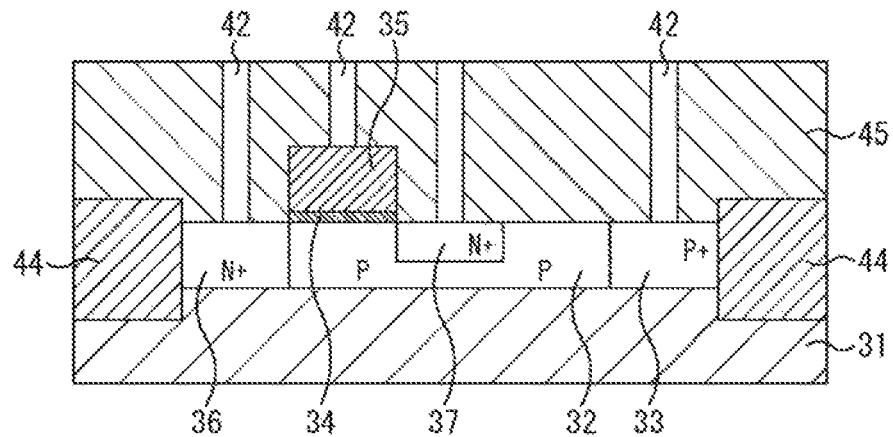
FIG. 14 is a diagram describing a method of manufacturing a pixel structure of the first embodiment.

Then, as illustrated in FIG. 14, when the insulation film 45 and the contact electrode 42 are additionally formed, a state shown in FIG. 4A is completed. The contact electrode 42 can be formed when the insulation film 45 is formed at a predetermined thickness, the insulation film 45 of the top surface of the semiconductor region to be put into contact is then opened by dry etching to form a contact hole, and a metal material such as aluminum, tungsten, titanium, cobalt, hafnium, or tantalum is put into the formed contact hole.

The insulation film 45 of a top surface of the semiconductor substrate 12 can be formed through a plurality of forming processes using different types of formation methods such as a thermal oxidation method, an atomic layer deposition method, and a plasma CVD method. In addition, the insulation film 45 can form a structure in which a plurality of types of insulating layers are laminated. For example, a silicon oxide film, TEOS, HDP, a silicon nitride film, or a silicon oxynitride film can be used as the insulation film 45.

According to the above formation method, a structure of the charge retention section 22 and the reset transistor 23 shown in FIG. 4A and FIG. 4B can be formed. That is, the N type semiconductor region 36 of a structure in which the bottom surface of the N type semiconductor region 36 and three side surfaces except a surface in contact with the P type semiconductor region 32 are covered by the insulation films 31, 44, and 45 can be formed. Accordingly, the depletion layer region of the N type semiconductor region 36 is only a surface that is in contact with the P type semiconductor region 32, as illustrated in FIG. 6A. Therefore, it is possible to suppress a dark current.

<First Modified Example>

Figure 15A:
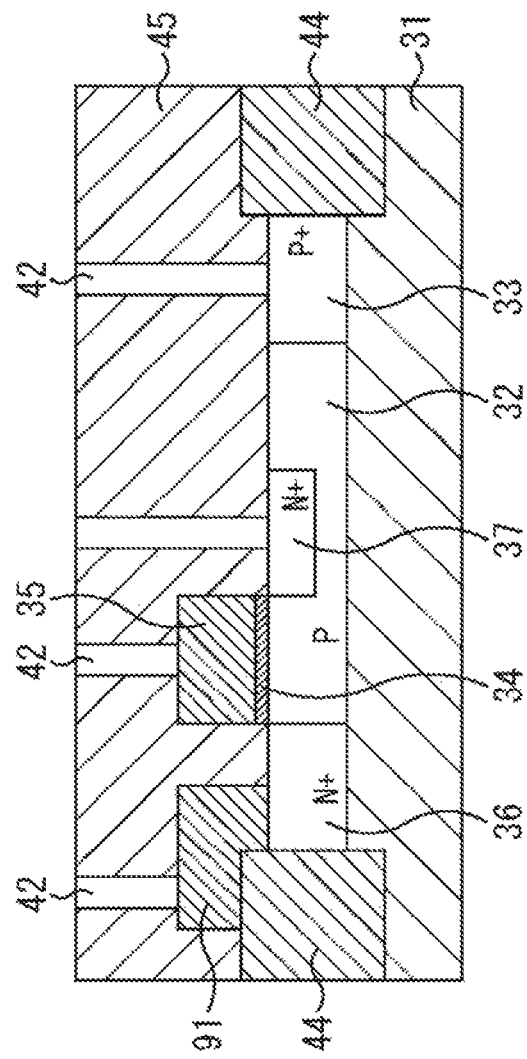
FIG. 15 is a diagram illustrating a first modified example of the pixel structure of the first embodiment.
Figure 15B:
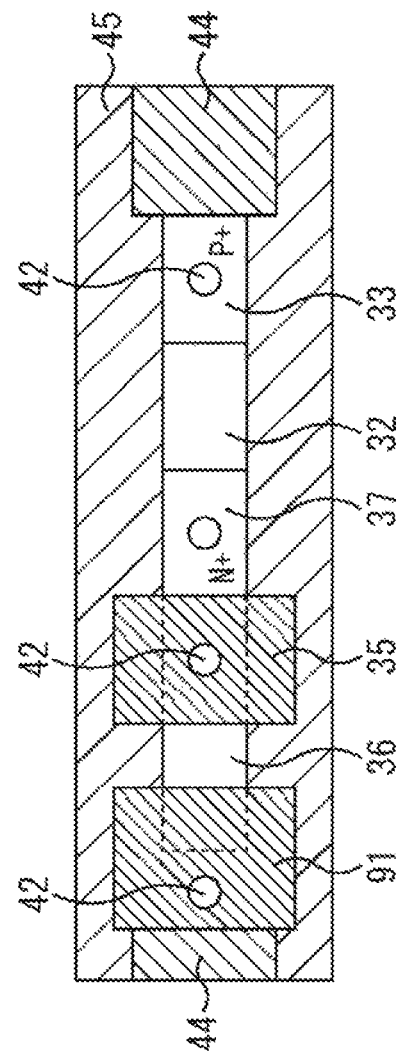

FIG. 15 is a diagram illustrating a first modified example of the above-described first embodiment. Similarly to FIG. 4A and FIG. 4B, a cross-sectional view and a top view around the N type semiconductor region 36 are shown.

In FIG. 15, parts corresponding to FIG. 4A and FIG. 4B are denoted by the same reference numerals and descriptions thereof will be omitted.

In the structure of the pixel 2 shown in FIG. 4A and FIG. 4B, the contact electrode 42 connected to the lower electrode 52B of the photoelectric conversion unit 21 is directly connected to the N type semiconductor region 36 serving as the source of the reset transistor 23.

On the other hand, in a structure of the pixel 2 of the first modified example shown in FIG. 15, a connection conductor 91 is formed on the top surface of the N type semiconductor region 36, and the contact electrode 42 connected to the lower electrode 52B of the photoelectric conversion unit 21 is connected to the connection conductor 91. Therefore, the contact electrode 42 connected to the lower electrode 52B of the photoelectric conversion unit 21 is connected to the N type semiconductor region 36 through the connection conductor 91.

When the contact electrode 42 is directly connected to the N type semiconductor region 36 by a formation method in which the insulation film 45 is opened by dry etching, and a metal material is put into a formed contact hole, a defect level of the N type semiconductor region 36 serving as a contact portion increases.

Here, as illustrated in FIG. 15, the connection conductor 91 using, for example, a silicon material is formed on the top surface of the N type semiconductor region 36, and the contact electrode 42 and the N type semiconductor region 36 can be connected through the connection conductor 91. Accordingly, it is possible to suppress a defect level of the N type semiconductor region 36 from increasing.

The connection conductor 91 can be formed of, for example, a silicon material doped with impurities such as phosphorus doped amorphous silicon (PDAS) or a silicon material in which ions are implanted after deposition. In addition, when the connection conductor 91 is formed of the same material as the gate electrode 35 of the reset transistor 23, it is possible to form the connection conductor 91 and the gate electrode 35 through the same process.

The bottom surface of the N type semiconductor region 36, and three side surfaces except a surface in contact with the P type semiconductor region 32 are covered by the insulation films 31, 44, and 45 in the first modified example as well. Accordingly, the depletion layer region of the N type semiconductor region 36 is only a surface in contact with the P type semiconductor region 32, similarly to FIG. 6A. Therefore, it is possible to suppress a dark current in the first modified example as well.

<Second Modified Example>

FIG. 16 is a diagram illustrating a second modified example of the above-described first embodiment and shows a cross-sectional view and a top view around the N type semiconductor region 36, similarly to FIG. 4A and FIG. 4B.

In FIG. 16, parts corresponding to FIG. 4A and FIG. 4B are denoted by the same reference numerals and descriptions thereof will be omitted.

In the structure of the pixel 2 shown in FIG. 4A and FIG. 4B, the P type semiconductor region 33 serving as a contact portion for fixing the P type semiconductor region 32 to a GND potential is arranged along a straight line that connects the N type semiconductor regions 36 and 37 serving as the source and the drain of the reset transistor 23, respectively.

On the other hand, in the structure of the pixel 2 of the second modified example shown in FIG. 16, the P type semiconductor region 33 is arranged in a direction perpendicular to a straight line that connects the N type semiconductor regions 36 and 37, which forms a T-shape with the N type semiconductor regions 36 and 37 serving as the source and the drain of the reset transistor 23, respectively.

In this manner, a position in which the P type semiconductor region 33 is arranged or a region size can be determined arbitrarily. In addition, positions of the N type semiconductor region 36 and 37 are arranged and region sizes can be determined arbitrarily as long as the depletion layer region of the N type semiconductor region 36 is only a surface in contact with the P type semiconductor region 32, similarly to FIG. 6A.

Therefore, when the depletion layer region of the N type semiconductor region 36 is only a surface in contact with the P type semiconductor region 32, similarly to FIG. 6A, it is possible to suppress a dark current in the second modified example as well.

2. Second Embodiment

Figure 17:
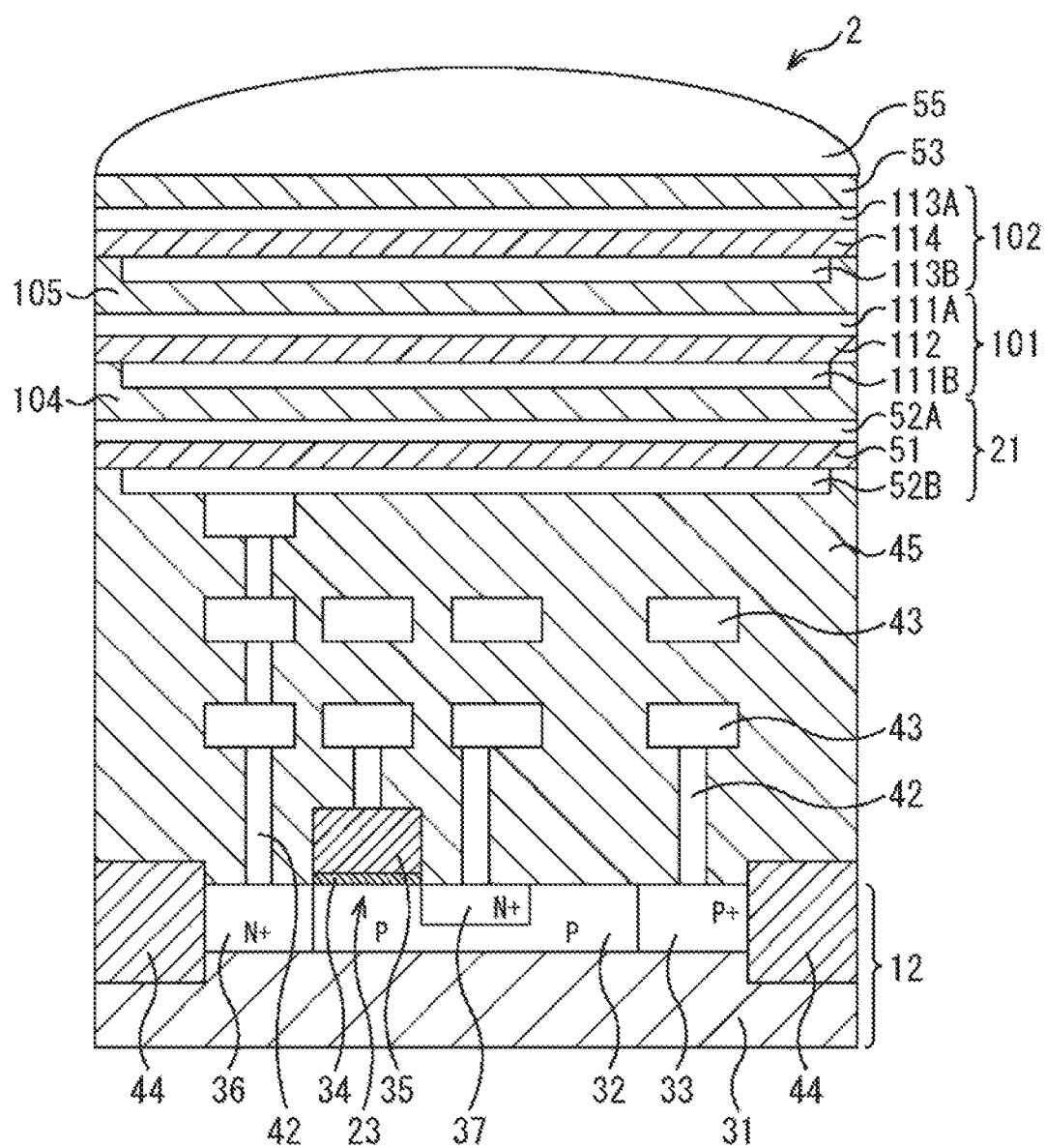
FIG. 17 is a cross-sectional view illustrating a pixel structure according to a second embodiment of a solid-state image capturing element.

FIG. 17 is a cross-sectional view illustrating a pixel structure according to a second embodiment of the solid-state image capturing element 1.

In FIG. 17, parts corresponding to the pixel structure of the above-described first embodiment are denoted by the same reference numerals and descriptions thereof will be appropriately omitted.

In the above-described first embodiment, as described with reference to FIG. 3, the pixel 2 has a configuration in which red, green, and blue color filters 54 are formed in, for example, a Bayer array on a top surface of the photoelectric conversion unit 21. Therefore, the solid-state image capturing element 1 of the first embodiment has a structure in which each of the pixels 2 receives only light of a wavelength of any of red, green, and blue.

On the other hand, the solid-state image capturing element 1 of the second embodiment has a structure in which each of the pixels 2 receives light of wavelengths of all of red, green, and blue.

Specifically, in the pixel 2 of the second embodiment, as illustrated in FIG. 17, a photoelectric conversion unit 101 serving as a second photoelectric conversion unit and a photoelectric conversion unit 102 serving as a third photoelectric conversion unit are formed above the photoelectric conversion unit 21 serving as a first photoelectric conversion unit.

The photoelectric conversion unit 21 of a bottom layer photoelectrically converts, for example, red light. The photoelectric conversion unit 101 of an intermediate layer photoelectrically converts green light. The photoelectric conversion unit 102 of a top layer photoelectrically converts blue light.

The photoelectric conversion unit 101 of the intermediate layer has a structure in which a photoelectric conversion film 112 is interposed between an upper electrode 111A and a lower electrode 111B. The photoelectric conversion unit 102 of the top layer has a structure in which a photoelectric conversion film 114 is interposed between an upper electrode 113A and a lower electrode 113B.

The upper electrodes 52A, 111A, and 113A and the lower electrodes 52B, 111B, and 113B are transparent electrodes that transmit light, and are formed by, for example, performing film formation using a metal oxide such as ITO by a film formation method such as a sputtering method. The lower electrode 52B of a bottom layer may be formed of an electrode film, for example, tungsten (W), aluminum (Al), or copper (Cu), similarly to the first embodiment.

As a material of the photoelectric conversion film 51 that photoelectrically converts red light, for example, ZnPc is used. As a material of the photoelectric conversion film 112 that photoelectrically converts green light, for example, quinacridone is used. As a material of the photoelectric conversion film 114 that photoelectrically converts blue light, for example, BCzVBi is used. In addition, as described above, as materials of the photoelectric conversion films 51, 112, and 114, a compound semiconductor such as a chalcopyrite structure semiconductor can be used in addition to an organic photoelectric conversion film.

The upper electrode 52A of the photoelectric conversion unit 21 of the bottom layer and the lower electrode 111B of the photoelectric conversion unit 101 of the intermediate layer are insulated by an insulation film 104. The upper electrode 111A of the photoelectric conversion unit 101 of the intermediate layer and the lower electrode 113B of the photoelectric conversion unit 102 of the top layer are insulated by an insulation film 105.

Similarly to the N type semiconductor region 36 connected to the lower electrode 52B of the photoelectric conversion unit 21 of the bottom layer, the lower electrode 111B of the photoelectric conversion unit 101 of the intermediate layer is connected to the N type semiconductor region serving as a contact portion with the semiconductor substrate 12 at a region that is not illustrated and signal charges generated in the photoelectric conversion unit 101 are captured in the semiconductor substrate 12.

In addition, similarly to the N type semiconductor region 36 connected to the lower electrode 52B of the photoelectric conversion unit 21 of the bottom layer, the lower electrode 113B of the photoelectric conversion unit 102 of the top layer is connected to the N type semiconductor region serving as a contact portion with the semiconductor substrate 12 at a region that is not illustrated and signal charges generated in the photoelectric conversion unit 102 are captured in the semiconductor substrate 12.

Then, similarly to the N type semiconductor region 36 described in the first embodiment, the N type semiconductor region serving as a contact portion of the photoelectric conversion units 101 and 102 is formed such that the depletion layer region is only a surface in contact with the P type semiconductor region 32. Therefore, it is possible to suppress a dark current in the pixel structure of the second embodiment as well.

3. Third Embodiment

Figure 18:
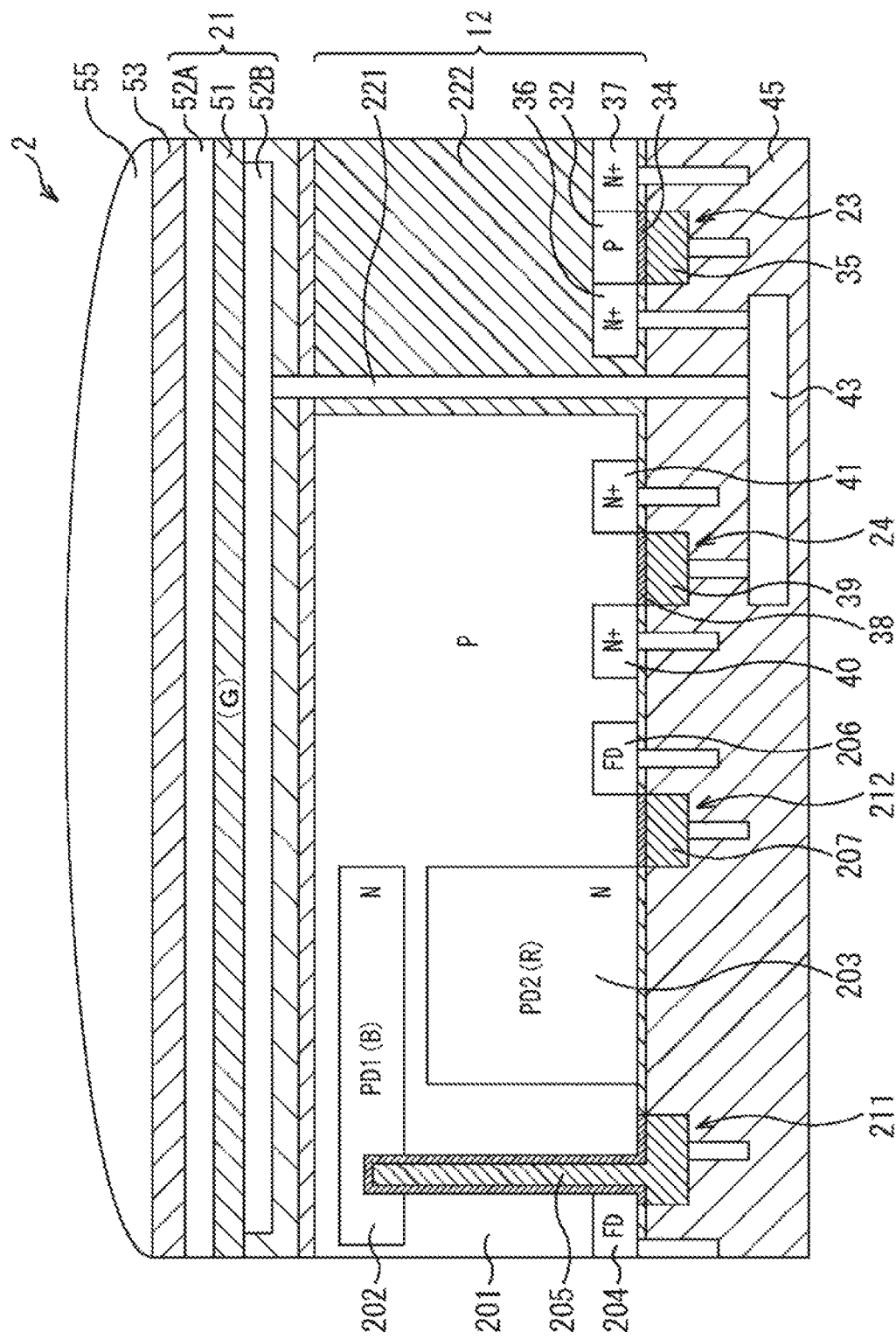
FIG. 18 is a cross-sectional view illustrating a pixel structure according to a third embodiment of a solid-state image capturing element.

FIG. 18 is a cross-sectional view illustrating a pixel structure according to a third embodiment of the solid-state image capturing element 1.

In FIG. 18, parts corresponding to the pixel structure of the above-described first embodiment are denoted by the same reference numerals and descriptions thereof will be appropriately omitted.

The solid-state image capturing element 1 of the above-described first and second embodiments has a front-illuminated type structure in which the color filter 54, the on-chip lens 55, and the photoelectric conversion unit 21 are formed on a front surface side in which the wiring layer 43 is formed with respect to the semiconductor substrate 12 and light is incident from the front surface side.

On the other hand, the solid-state image capturing element 1 of the third embodiment shown in FIG. 18 has a back-illuminated type structure. That is, in the pixel structure of FIG. 18, the color filter 54, the on-chip lens 55, the photoelectric conversion unit 21 and the like are formed on a back surface side opposite to the front surface side in which the wiring layer 43 is formed with respect to the semiconductor substrate 12, and light is incident from the back surface side of the semiconductor substrate 12.

The semiconductor substrate 12 is formed in, for example, a P type semiconductor region (P-Well) 201. Inside the P type semiconductor region 201, two N type semiconductor regions 202 and 203 are laminated and formed in a depth direction and photodiodes PD1 and PD2 are configured by two PN junctions. According to a difference of a light absorption coefficient, the photodiode PD1 photoelectrically converts blue light and the photodiode PD2 photoelectrically converts red light.

A transfer transistor 211 configured to transfer signal charges obtained by receiving blue light is configured by the N type semiconductor regions 202 and 204 and a gate electrode 205 formed in a depth direction of the semiconductor substrate 12. The transfer transistor 211 transfers signal charges that are accumulated in the N type semiconductor region 202 and correspond to the received blue light to the N type semiconductor region 204 serving as floating diffusion (FD).

A transfer transistor 212 configured to transfer signal charges obtained by receiving red light is configured by the N type semiconductor regions 203 and 206 and a gate electrode 207 formed on a front surface side of the semiconductor substrate 12. The transfer transistor 212 transfers signal charges that are accumulated in the N type semiconductor region 203 and correspond to the received red light to the N type semiconductor region 206 serving as FD.

The photoelectric conversion unit 21 formed on the back surface side of the semiconductor substrate 12 receives green light and generates signal charges according to an amount of received light.

Similarly to the above-described first embodiment, the reset transistor 23 and the amplifying transistor 24 are formed on the front surface side of the semiconductor substrate 12 in which the plurality of wiring layers 43 are formed.

The source of the reset transistor 23 and the N type semiconductor region 36 that also serves as the charge retention section 22 are connected to the lower electrode 52B of the photoelectric conversion unit 21 through a through electrode 221 that penetrates through the semiconductor substrate 12 and the wiring layer 43. In addition, the N type semiconductor region 36 is connected to the gate electrode 39 of the amplifying transistor 24 through the wiring layer 43.

The bottom surface (a surface opposite to a surface of the gate electrode 35 side) of the N type semiconductor region 36 serving as the charge retention section 22 and three side surfaces except a surface in contact with the P type semiconductor region 32 are covered by an insulation film 222. Accordingly, the depletion layer region of the N type semiconductor region 36 is only a surface in contact with the P type semiconductor region 32, as illustrated in FIG. 6A. Therefore, it is possible to suppress a dark current in the third embodiment as well.

In the third embodiment shown in FIG. 18, while the two photodiodes PD1 and PD2 are formed in the semiconductor substrate 12, it is also possible for only one of the photodiodes PD1 and PD2 to be formed.

4. Fourth Embodiment

Figure 19:
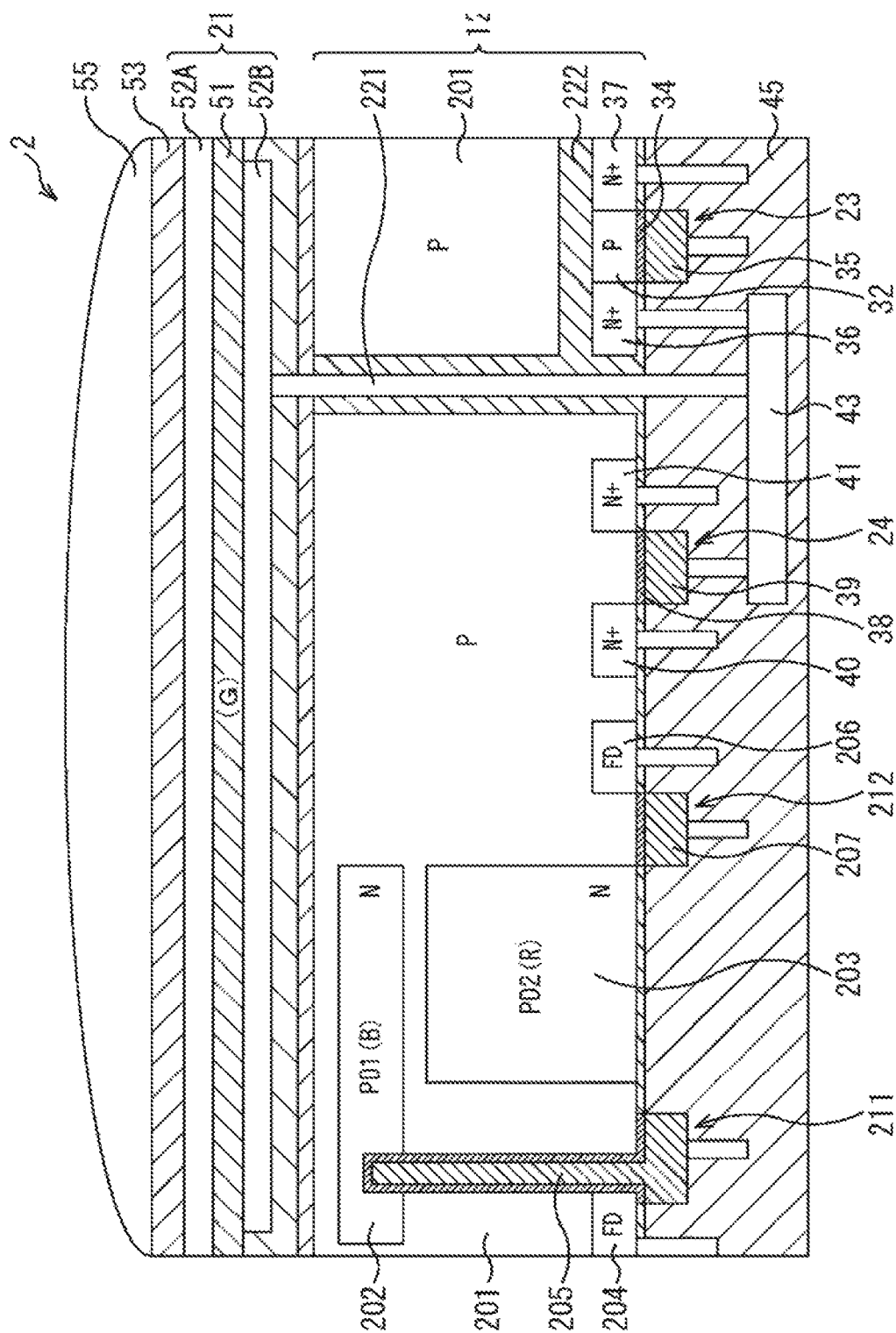
FIG. 19 is a cross-sectional view illustrating a pixel structure according to a fourth embodiment of a solid-state image capturing element.

FIG. 19 is a cross-sectional view illustrating a pixel structure according to a fourth embodiment of the solid-state image capturing element 1.

In FIG. 19, parts corresponding to the pixel structure of the third embodiment shown in FIG. 18 are denoted by the same reference numerals and descriptions thereof will be appropriately omitted.

In the pixel structure of the fourth embodiment, on a bottom surface side (a side opposite to the gate electrode 35 side) of the N type semiconductor regions 36 and 37 of the reset transistor 23 and a region including the P type semiconductor region 32 formed therebetween, the insulation film 222 is formed with a predetermined thickness. Then, similarly to the region in which the photodiodes PD1 and PD2 are formed, the P type semiconductor region 201 is formed on a back surface side of the substrate relative to the insulation film 222.

That is, in the third embodiment shown in FIG. 18, the bottom surface side of the N type semiconductor regions 36 and 37 of the reset transistor 23 and a region including the P type semiconductor region 32 formed therebetween has the same thickness as the P type semiconductor region 201 only due to the insulation film 222. On the other hand, the fourth embodiment has a structure in which the insulation film 222 having a predetermined thickness is formed on the P type semiconductor region 201 and the N type semiconductor regions 36 and 37 and the like are formed on the insulation film 222.

In a structure in which the N type semiconductor regions 36 and 37 and the like are formed on the insulation film 222 having a predetermined thickness, a method in which an isolation SOI structure is used, the insulation film 222 is formed and a semiconductor region is then formed according to epitaxial growth can be used.

The bottom surface of the N type semiconductor region 36 serving as the charge retention section 22 and three side surfaces except a surface in contact with the P type semiconductor region 32 are covered by the insulation film 222 in the pixel structure of the fourth embodiment as well. Accordingly, the depletion layer region of the N type semiconductor region 36 is only a surface in contact with the P type semiconductor region 32, as illustrated in FIG. 6A. Therefore, it is possible to suppress a dark current in the third embodiment as well.

As described above, the solid-state image capturing element 1 of the present disclosure has a structure in which the bottom surface of the N type semiconductor region 36 serving as the charge retention section 22 and three side surfaces except a surface in contact with the P type semiconductor region 32 are covered by the insulation film 222. Accordingly, as illustrated in FIG. 6A, the depletion layer region of the N type semiconductor region 36 is minimized to be only a surface in contact with the P type semiconductor region 32. That is, when an area of the depletion layer that is exposed to an interface between the insulation film 222 and the P type semiconductor region 32 is minimized, it is possible to suppress generation of a dark current from the N type semiconductor region 36 serving as the charge retention section 22.

In addition, in the solid-state image capturing element 1 of the present disclosure, the N type semiconductor regions 36 and 37 serving as the source and the drain of the reset transistor 23, respectively, and the P type semiconductor regions 32 and 33 are separated from other elements such as the amplifying transistor 24 by the insulation film 44. Accordingly, a fixed potential for fixing the P type semiconductor region 32 to a predetermined potential can be set to a different value from the other elements.

<5. Examples of Applications to Electronic Device>

The above-described solid-state image capturing element 1 can be applied to various electronic devices, for example, an image capturing apparatus such as a digital still camera and a digital video camera, a mobile phone having an image capturing function and an audio player having an image capturing function.

Figure 20:
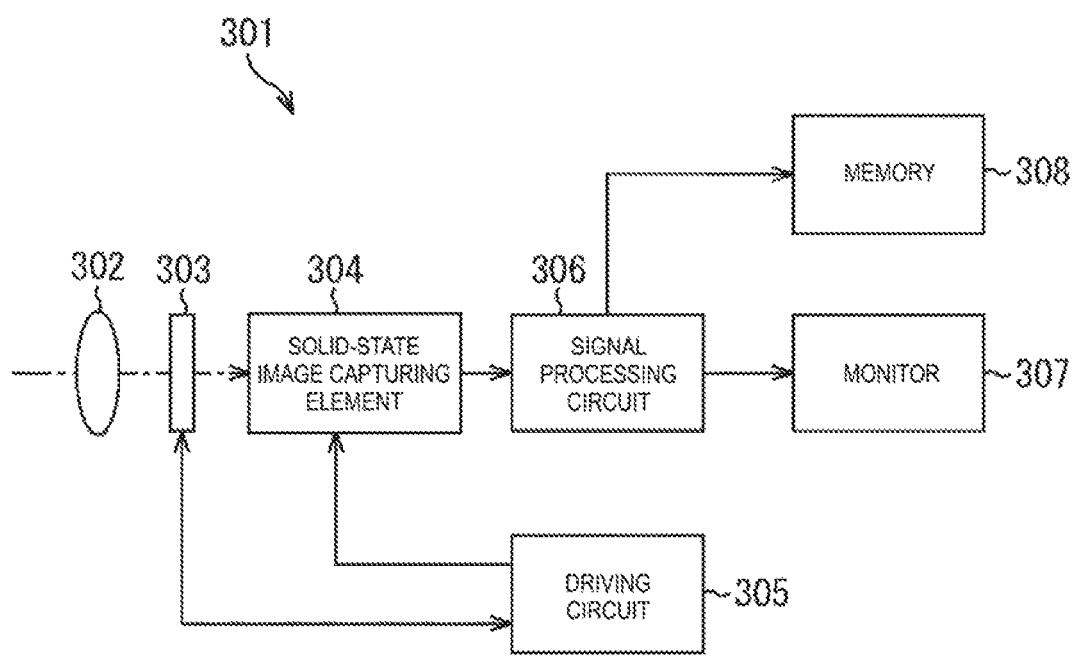
FIG. 20 is a block diagram illustrating an exemplary configuration of an image capturing device as an electronic device according to the present disclosure.

FIG. 20 is a block diagram illustrating an exemplary configuration of an image capturing apparatus as an electronic device according to the present disclosure.

An image capturing apparatus 301 shown in FIG. 20 includes an optical system 302, a shutter device 303, a solid-state image capturing element 304, a control circuit 305, a signal processing circuit 306, a monitor 307, and a memory 308 and can image a still image and a moving image.

The optical system 302 includes one or a plurality of lenses, guides light (incident light) from a subject to the solid-state image capturing element 304, and forms an image on a light receiving surface of the solid-state image capturing element 304.

The shutter device 303 is arranged between the optical system 302 and the solid-state image capturing element 304 and controls a light emitting period and light blocking period of the solid-state image capturing element 304 under control of the control circuit 305.

The solid-state image capturing element 304 includes the above-described solid-state image capturing element 1. The solid-state image capturing element 304 accumulates signal charges for a certain period of time according to light formed on a light receiving surface through the optical system 302 and the shutter device 303. The signal charges accumulated in the solid-state image capturing element 304 are transferred according to a driving signal (a timing signal) supplied from the control circuit 305. The solid-state image capturing element 304 may be configured as one chip alone or may be configured as a part of a camera module that is packaged with the optical system 302 or the signal processing circuit 306.

The control circuit 305 outputs a driving signal that is used to control a transfer operation of the solid-state image capturing element 304 and a shutter operation of the shutter device 303, and drives the solid-state image capturing element 304 and the shutter device 303.

The signal processing circuit 306 performs various types of signal processing of a pixel signal output from the solid-state image capturing element 304. An image (image data) obtained when the signal processing circuit 306 performs signal processing is supplied to and displayed on the monitor 307, and is supplied to and stored (recorded) in the memory 308.

As described above, when the solid-state image capturing element 1 according to each of the above-described embodiments is used as the solid-state image capturing element 304, an image (a signal) in which a dark current is suppressed is generated. Therefore, in a video camera and a digital still camera, and in the image capturing apparatus 301 such as a camera module for a mobile device, for example, a mobile phone, it is possible to provide a high quality captured image.

Embodiments of the present disclosure are not limited to the above embodiments, and various changes may be made within the scope while not departing from the gist of the present disclosure.

In the above example, the solid-state image capturing elements in which the P type and the N type are used as the first and second conductivity types, and the electrons are used as the signal charges have been described. However, the present disclosure can be applied to a solid-state image capturing element in which the holes are used as the signal charges. In other words, the semiconductor regions described above may be configured with semiconductor regions of opposite conductivity types using the N type and the P type as the first and second conductivity types.

The present disclosure is not limited to the application to the solid-state image capturing element that detects a distribution of an incident light amount of visible light and captures an image thereof and can be applied to all solid-state image capturing elements that capture an image of a distribution of an incidence amount of infrared rays, X rays, particles, or the like or all solid-state image capturing elements (physical amount distribution detection devices) such as fingerprint detection sensors that detect a distribution of other physical amounts such as pressure or capacitance and captures an image thereof as a broad meaning.

Embodiments of the present disclosure are not limited to the above embodiments, and various changes may be made within the scope while not departing from the gist of the present disclosure.

For example, a form in which all or some of a plurality of embodiments described above are combined may be employed.

The effects described in this specification are merely exemplary and are not to be limited, and any other effect described in this specification may be included.

Additionally, the present technology may also be configured as below.

(1) A solid-state image capturing element including:
　a photoelectric conversion unit formed outside a semiconductor substrate; and
　a charge retention section that is formed in the semiconductor substrate and retains charges generated in the photoelectric conversion unit,
　wherein, among surfaces of the charge retention section, a bottom surface on a side opposite to a surface of a gate side of a transistor formed in the semiconductor substrate is covered by an insulation film.
(2) The solid-state image capturing element according to (1), wherein the charge retention section is a source of a reset transistor configured to reset charges retained in the charge retention section.
(3) The solid-state image capturing element according to (2), wherein the charge retention section has one side surface that is formed under a gate of the reset transistor and is in contact with a semiconductor region having an opposite conductivity type to the charge retention section.
(4) The solid-state image capturing element according to (3), wherein, among side surfaces of the charge retention section, side surfaces other than a surface in contact with the semiconductor region formed under a gate of the reset transistor are in contact with an insulation film.
(5) The solid-state image capturing element according to (4), wherein, among surfaces of the charge retention section, a surface of a gate side of the reset transistor is covered by an insulation film except a contact portion that is electrically connected to the photoelectric conversion unit.
(6) The solid-state image capturing element according to (4), wherein the insulation film in contact with a side surface of the charge retention section is formed through STI.
(7) The solid-state image capturing element according to (4), wherein the insulation film in contact with a side surface of the charge retention section is formed by a thermal oxidation method.
(8) The solid-state image capturing element according to (3), wherein a contact portion configured to supply a fixed potential to the semiconductor region formed under a gate of the reset transistor is arranged along a straight line that connects a source and a drain of the reset transistor.
(9) The solid-state image capturing element according to (3), wherein a contact portion configured to supply a fixed potential to the semiconductor region formed under a gate of the reset transistor is arranged in a direction perpendicular to a straight line that connects a source and a drain of the reset transistor.
(10) The solid-state image capturing element according to any of (2) to (9), wherein an insulation film is formed around the reset transistor and thus the reset transistor is electrically separated from other pixel transistors.
(11) The solid-state image capturing element according to any of (1) to (10), wherein a connection conductor formed of a silicon material doped with impurities is formed above the charge retention section, and the charges generated in the photoelectric conversion unit are retained in the charge retention section through a contact electrode formed of a metal material and the connection conductor.
(12) The solid-state image capturing element according to any of (1) to (11), including:
　a plurality of the photoelectric conversion units and a plurality of the charge retention sections.
(13) The solid-state image capturing element according to any of (1) to (11), further including:
　one or more photodiodes in the semiconductor substrate.
(14) The solid-state image capturing element according to any of (1) to (12), wherein the solid-state image capturing element is of a front-illuminated type.
(15) The solid-state image capturing element according to any of (1) to (11) and (13), wherein the solid-state image capturing element is of a back-illuminated type.
(16) A method of manufacturing a solid-state image capturing element, the method including:
　forming the charge retention section in a semiconductor layer that is formed on an insulation film of a semiconductor substrate; and
　forming a photoelectric conversion unit outside the semiconductor substrate,
　wherein, among surfaces of the charge retention section, a bottom surface on a side opposite to a surface of a gate side of a transistor formed in the semiconductor substrate is covered by the insulation film.
(17) An electronic device including:
　a solid-state image capturing element including
　　a photoelectric conversion unit formed outside a semiconductor substrate, and
　　a charge retention section that is formed in the semiconductor substrate and retains charges generated in the photoelectric conversion unit,
　　wherein, among surfaces of the charge retention section, a bottom surface on a side opposite to a surface of a gate side of a transistor formed in the semiconductor substrate is covered by an insulation film.

REFERENCE SIGNS LIST

1 solid-state image capturing element
2 pixel
21 photoelectric conversion unit
22 charge retention section
23 reset transistor
31 insulation film
32 P type semiconductor region
44 insulation film
101, 102 photoelectric conversion unit
PD1, PD2 photodiode
301 image capturing apparatus
304 solid-state image capturing element

The invention claimed is:
1. A solid-state image capturing element, comprising:
　a semiconductor substrate that comprises a first insulation film and a semiconductor region;
　a reset transistor in the semiconductor substrate;
　at least one photoelectric conversion unit on the semiconductor substrate,
　　wherein the at least one photoelectric conversion unit is configured to generate charges;

at least one charge retention section in the semiconductor substrate, wherein the at least one charge retention section is configured to retain the generated charges,
a bottom surface of the at least one charge retention section is in contact with the first insulation film, and
the bottom surface of the at least one charge retention section is opposite to a surface of a gate side of the reset transistor;
a second insulation film adjacent to a first side surface of the at least one charge retention section;
a third insulation film on a top surface of the at least one charge retention section, wherein
the second insulation film is in contact with each of the third insulation film and the first insulation film,
each of a second side surface of the at least one charge retention section and a third side surface of the at least one charge retention section is in contact with the third insulation film,
a fourth side surface of the at least one charge retention section is under the surface of the gate side of the reset transistor,
the first side surface of the at least one charge retention section is opposite to the fourth side surface of the at least one charge retention section, and
the fourth side surface of the at least one charge retention section is in contact with the semiconductor region of the semiconductor substrate;
a connection conductor above the first side surface of the at least one charge retention section and the second insulation film;
a contact electrode on the connection conductor, wherein the connection conductor is in contact with the at least one charge retention section, the second insulation film, and the contact electrode; and
a color filter at a light incident side of the at least one photoelectric conversion unit.

2. The solid-state image capturing element according to claim 1, wherein
the at least one charge retention section corresponds to a source of the reset transistor, and
the reset transistor is configured to reset the retained charges in the at least one charge retention section.

3. The solid-state image capturing element according to claim 2, wherein the third insulation film is around a gate electrode of the reset transistor.

4. The solid-state image capturing element according to claim 2, wherein
the semiconductor region has a conductivity type opposite to a conductivity type of the at least one charge retention section.

5. The solid-state image capturing element according to claim 4, further comprising a contact portion configured to supply a fixed potential to the semiconductor region, wherein
the semiconductor region is under the surface of the gate side of the reset transistor, and
the contact portion is along a straight line that connects the source of the reset transistor and a drain of the reset transistor.

6. The solid-state image capturing element according to claim 4, further comprising a contact portion configured to supply a fixed potential to the semiconductor region, wherein
the semiconductor region is under the surface of the gate side of the reset transistor,
the contact portion is in a direction perpendicular to a straight line, and
the straight line connects the source of the reset transistor and a drain of the reset transistor.

7. The solid-state image capturing element according to claim 1, wherein
a first portion of the top surface of the at least one charge retention section is in contact with the third insulation film,
the first portion of the top surface is different from a contact portion of the top surface, and
the contact portion of the top surface is electrically connected to the at least one photoelectric conversion unit.

8. The solid-state image capturing element according to claim 1, wherein
the connection conductor comprises a silicon material doped with impurities, and
the at least one charge retention section is further configured to retain the generated charges based on a metal electrode and the connection conductor.

9. The solid-state image capturing element according to claim 1, further comprising:
a plurality of photoelectric conversion units; and
a plurality of charge retention sections.

10. The solid-state image capturing element according to claim 1, further comprising at least one photodiode in the semiconductor substrate.

11. The solid-state image capturing element according to claim 1, wherein the solid-state image capturing element corresponds to a back-illuminated type image capturing element.

12. A method of manufacturing a solid-state image capturing element, the method comprising:
forming a photoelectric conversion unit on a semiconductor substrate, wherein
the semiconductor substrate comprises a first insulation film and a semiconductor layer on the first insulation film, and
the semiconductor layer includes a semiconductor region;
forming a charge retention section in the semiconductor layer, wherein
a bottom surface of the charge retention section is in contact with the first insulation film,
the bottom surface of the charge retention section is opposite to a surface of a gate side of a reset transistor, and
the reset transistor is in the semiconductor substrate;
forming a second insulation film adjacent to a first side surface of the charge retention section;
forming a third insulation film on a top surface of the charge retention section, wherein
the second insulation film is in contact with each of the third insulation film and the first insulation film,
each of a second side surface of the charge retention section and a third side surface of the charge retention section is in contact with the third insulation film,
a fourth side surface of the charge retention section is under the surface of the gate side of the reset transistor,
the first side surface of the charge retention section is opposite to the fourth side surface of the charge retention section, and the fourth side surface of the charge retention section is in contact with the semiconductor region of the semiconductor layer;
forming a connection conductor above the first side surface of the charge retention section and the second insulation film;
forming a contact electrode on the connection conductor, wherein the connection conductor is in contact with the charge retention section, the second insulation film, and the contact electrode; and
forming a color filter at a light incident side of the photoelectric conversion unit.

13. An electronic device, comprising:
a solid-state image capturing element comprising:
- a semiconductor substrate that comprises a first insulation film and a semiconductor region;
- a reset transistor in the semiconductor substrate;
- a photoelectric conversion unit on the semiconductor substrate, wherein the photoelectric conversion unit is configured to generate charges;
- a charge retention section in the semiconductor substrate, wherein
  the charge retention section is configured to retain the generated charges,
  a bottom surface of the charge retention section is in contact with the first insulation film, and
  the bottom surface of the charge retention section is opposite to a surface of a gate side of the reset transistor;
- a second insulation film adjacent to a first side surface of the charge retention section;
- a third insulation film on a top surface of the charge retention section, wherein
  the second insulation film is in contact with each of the third insulation film and the first insulation film,
  each of a second side surface of the charge retention section and a third side surface of the charge retention section is in contact with the third insulation film,
  a fourth side surface of the charge retention section is under the surface of the gate side of the reset transistor,
  the first side surface of the charge retention section is opposite to the fourth side surface of the charge retention section, and
  the fourth side surface of the charge retention section is in contact with the semiconductor region of the semiconductor substrate;
- a connection conductor above the first side surface of the charge retention section and the second insulation film;
- a contact electrode on the connection conductor, wherein the connection conductor is in contact with the charge retention section, the second insulation film, and the contact electrode; and
- a color filter at a light incident side of the photoelectric conversion unit.

14. The solid-state image capturing element according to claim 1, wherein the connection conductor is connected to the at least one photoelectric conversion unit through the contact electrode.

* * * * *